(12) United States Patent
Kasper et al.

(10) Patent No.: US 11,906,593 B2
(45) Date of Patent: Feb. 20, 2024

(54) METHOD AND SYSTEM FOR TESTING THE STRUCTURAL INTEGRITY OF A METAL JOINT

(71) Applicant: Keysight Technologies, Inc., Santa Rosa, CA (US)

(72) Inventors: Manuel Kasper, Traun (AT); Manuel Moertelmaier, Wels (AT)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 352 days.

(21) Appl. No.: 17/007,218

(22) Filed: Aug. 31, 2020

(65) Prior Publication Data

US 2021/0132154 A1 May 6, 2021

Related U.S. Application Data

(60) Provisional application No. 62/928,522, filed on Oct. 31, 2019.

(51) Int. Cl.
*G01R 31/389* (2019.01)
*B23K 31/12* (2006.01)
*G01R 31/382* (2019.01)
*G01N 27/04* (2006.01)
*G01N 27/20* (2006.01)

(52) U.S. Cl.
CPC .......... *G01R 31/389* (2019.01); *B23K 31/125* (2013.01); *G01N 27/041* (2013.01); *G01N 27/20* (2013.01); *G01R 31/382* (2019.01)

(58) Field of Classification Search
CPC .. G01R 31/389; G01R 31/382; B23K 31/125; G01N 27/041; G01N 27/20
See application file for complete search history.

(56) References Cited

U.S. PATENT DOCUMENTS

| | | | |
|---|---|---|---|
| 10,189,118 B2 | 1/2019 | Cai et al. | |
| 2002/0017144 A1* | 2/2002 | Miles | G01N 3/32 |
| | | | 73/808 |
| 2012/0286945 A1* | 11/2012 | Lev | G01R 31/66 |
| | | | 702/38 |
| 2017/0348804 A1* | 12/2017 | Cai | B23K 31/125 |
| 2019/0152001 A1 | 5/2019 | Cai et al. | |
| 2019/0280397 A1* | 9/2019 | Newcomb | B32B 7/12 |

FOREIGN PATENT DOCUMENTS

CN 106597315 * 4/2017
EP 3438682 A1 2/2019

\* cited by examiner

*Primary Examiner* — Natalie Huls

(57) ABSTRACT

A method is for testing the structural integrity of a metal joint such as a weld. The method includes applying stress to the metal joint, and measuring a resistance of a circuit including the metal joint during application of the stress to the metal joint. A structural integrity of the metal joint is determined by comparing the measured resistance with a baseline resistance.

17 Claims, 9 Drawing Sheets

METHOD AND SYSTEM FOR TESTING THE STRUCTURAL INTEGRITY OF A METAL JOINT

CROSS-REFERENCE TO RELATED APPLICATIONS

This present application is claims priority under 35 U.S.C. § 119(e) from U.S. Provisional Application 62/928,522 filed on Oct. 31, 2019, which names Manuel Kaspar, et al. as inventors. The entire disclosure of U.S. Provisional Application 62/928,522 is specifically incorporated herein by reference.

BACKGROUND

A variety of techniques for the non-destructive testing of welds are generally known, each of which suffer certain drawbacks. For example, visual inspection (or image recognition-based inspection) offers high throughput and reproducibility, but does not give information as to the interior of the weld. Visual inspection also requires that the weld not be obscured by packaging. Radiographic inspection also allows for high throughput, and does reveal the interior of the weld, but requires expensive equipment and radiological shielding. Ultrasonic inspection requires the direct application of a probe or scan head to all relevant welds, which poses an automation challenge if a large number of small but separate welds per item need to be inspected. Similarly, eddy current inspection requires direct, localized contact, necessitating substantial mechanical automation. Liquid penetrant inspection and magnetic particle inspection are also known, but these require the application of a working medium, or particles, which is generally too cumbersome for high-throughput manufacturing of relatively inexpensive items such as batteries.

Existing nondestructive techniques for testing of welds thus either fail to access the interior of the weld, require expensive equipment, or require multiple mechanical contacts per manufactured item.

SUMMARY

According to one aspect of the inventive concepts, a method of testing the structural integrity of a metal joint is provided. The method includes applying stress to the metal joint, measuring a resistance of a circuit including the metal joint during application of the stress to the metal joint, and determining a structural integrity of the metal joint according to a magnitude of a difference between the measured resistance and a baseline resistance.

The metal joint may be a weld, such as the weld of a battery.

The resistance may be measured using four-terminal (4T) sensing, and the measured and baseline resistances may be respectively obtained from a real part of a measured complex impedance of the metal joint under stress and a real part of a measured complex impedance of the metal joint not under stress.

The stress may be at least one of mechanical stress, thermal stress, acoustic stress and electrical stress. The stress may be applied by driving an electric current through the metal joint, such as a pulsed DC current through the metal joint, or by a mechanical actuator.

The method may further include obtaining the baseline resistance by measuring a resistance of the metal joint in the absence of stress applied to the metal joint.

According to another aspect of the inventive concepts, a system for testing the structural integrity of a metal joint is provided. The system includes a stimulus device configured to stress the metal joint, a resistance measuring device configured to measure a resistance of the metal joint while the metal joint is stressed by the stimulus device, and a test automation platform. The test automation platform includes a memory that stores executable instructions, and a processor configured to execute the instructions retrieved from the memory, wherein the instructions, when executed, cause the processor to determine a structural integrity of the metal joint based on a comparison between the measured resistance and a baseline resistance.

The stimulus device and the resistance measuring device may operate under control of the test automation platform.

The resistance measuring device may be configured to measure a complex impedance of the metal joint while the metal joint is under stress, and the instructions, when executed, may cause the processor to determine a difference between a real component of the measured impedance and the baseline resistance.

The stress may be at least one of mechanical stress, thermal stress, acoustic stress and electrical stress. The stimulus device may include a mechanical actuator configured to apply mechanical stress to the metal joint, or a current source configured to apply a pulsed DC current across the metal joint.

The metal joint may be a weld.

According to another aspect of the inventive concepts, a method of testing the structural integrity of a metal joint is provided. The method includes measuring a resistance of the metal joint to obtain a baseline impedance of the metal joint, applying stress to the metal joint, measuring a resistance of the metal joint during application of the stress to the metal joint to obtain a stressed resistance of the weld, determining a tested difference between the baseline resistance of the metal joint and the stressed resistance of the metal joint, and comparing the tested difference to a threshold value. The test result is a lack of structural integrity when the tested difference exceeds the threshold value.

The metal joint may be a weld, and the stress may be at least one of mechanical stress, thermal stress, acoustic stress and electrical stress.

BRIEF DESCRIPTION OF THE DRAWINGS

The above and other aspects and features of the inventive concepts will become readily apparent from the detailed description that follows, with reference to the accompanying drawings, in which.

DETAIL DESCRIPTION

Methods and systems for testing the structural integrity of metal joints of the inventive concepts are based on impedance (or resistance) measurements that require only two electrical contacts to be established. These contacts do not require a high degree of reproducibility, as the focus is on the observation of induced changes in impedance (or resistance), as opposed to absolute impedance (or resistance) values. This allows for a reduction in the demands placed on the mechanical automation required to establish the contacts, thereby increasing throughput and reproducibility and reducing cost.

Further, the methods and systems of the inventive concepts classify metal joints directly based on their electrical properties. In the context of battery manufacturing, and welding of contacts, it is this property that is of greatest interest (as opposed to, e.g. mechanical load-bearing capacity). This allows for an assessment a relevant quality aspect more directly than existing approaches that measure other aspects of the weld, such as visual homogeneity.

The description below presents as examples the testing of the welds of a pouch cell battery. However, the inventive concepts are in no way limited to the particular type of metal joint being tested (such as a weld), and are in no way limited to the item of manufacture containing the metal joint (such as a battery). As examples, other types of metal joints that may be tested in accordance with the inventive concepts include solder joints and brazing joints.

Further, in the case of weld joints, the inventive concepts are not limited by the type of welding process. As examples, the process used to form the weld joint being tested may be MIG—Gas Metal Arc Welding (GMAW), TIG—Gas Tungsten Arc Welding (GTAW), Stick—Shielded Metal Arc Welding (SMAW), Flux-Cored Arc Welding (FCAW), Energy Beam Welding (EBW), Atomic Hydrogen Welding (AHW), Gas Tungsten-Arc Welding, and Plasma Arc Welding. Likewise, the inventive concepts are not limited by the type of weld joint. As examples, the type of weld joint may be a lap joint, a butt joint, a corner joint, a T-joint and an edge Joint.

Figure 1A:
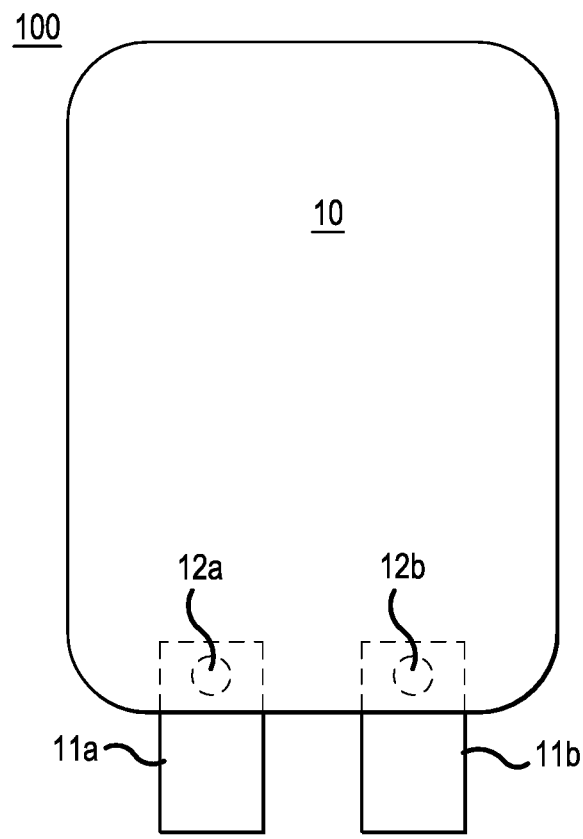
FIGS. 1A and 1B are schematic views of a pouch cell battery which constitutes an example of an item of manufacture having a metal joint to be tested.
Figure 1B:
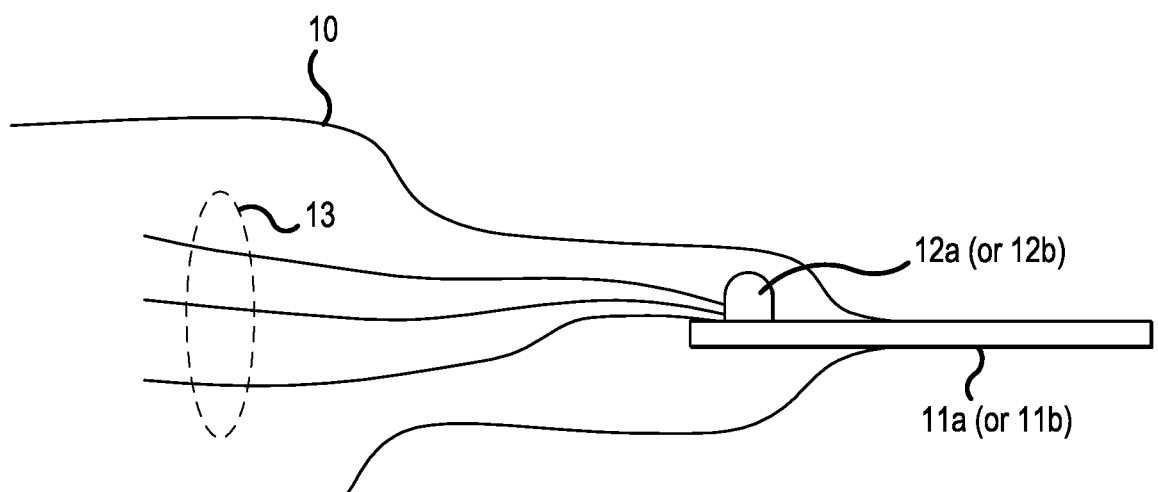

FIG. 1A is a top schematic view of a pouch cell battery 100, and FIG. 1B is a partial cutaway side view of the pouch cell battery of FIG. 1A. Referring collectively to FIGS. 1A and 1B, the pouch cell battery 100 includes an outer casing or pouch 10, and external electrodes 11a and 11b. Within the pouch 10 are one or more battery cells (not shown) that are electrically connected to the external electrodes 11a and 11b. In this example, the battery cells are connected to the external electrodes 11a and 11b by the welding of internal electrode foils 13 to the external electrodes 11a and 11b. The resultant welds are shown as reference numbers 12a and 12b in FIGS. 1A and 1B. As best seen in FIG. 1B, the welds 12a and 12b are enclosed within the pouch 10, and are thus not visible to the naked eye or image recognition cameras.

A method of testing the structural integrity of the welds 12a and 12b of the pouch cell battery 100 of FIGS. 1A and 1B according to an embodiment of the inventive concepts will now be described with reference to FIG. 2.

Without intending to be limited by terminology, this and other embodiments described herein include a "stimulus" component and a "read-out" component.

The stimulus component is characterized by providing some disturbance or stress to the metal joint being tested. As examples, the stress can take the form of mechanical stress, thermal stress, acoustic stress and electrical stress. An example of mechanical stress is the application of a compressive force to the metal joint from a mechanical actuator. On the other hand, thermal stress can, for example, be applied to the metal joint by localized infrared heating or a laser. An example of electrical stress is a relatively strong DC current, or a relatively strong pulsed DC current, that is applied across the metal joint. The acoustic stress may, for example, take the form of sound waves that induce vibrations in the metal joint.

The read-out component is characterized by a resistive (or impedance) measurement across the metal joint being tested while the metal joint is under the stress of the stimulus component. This stress-induced resistive measurement is compared to a baseline resistance that denotes the resistance of the metal joint while not under stress. The baseline resistance can be determined in advance, or contemporaneously with the stress-induced resistive measurement. As previously mentioned, the focus is on the change in resistance from a non-stressed state to a stressed state, rather than on absolute values of the measurements themselves. Without being bound by theory, the inventors hypothesize that metal joints of relatively low structural integrity exhibit greater instability when stressed, i.e., greater variations in resistance or impedance, than metal joints of higher structural integrity.

Figure 2:
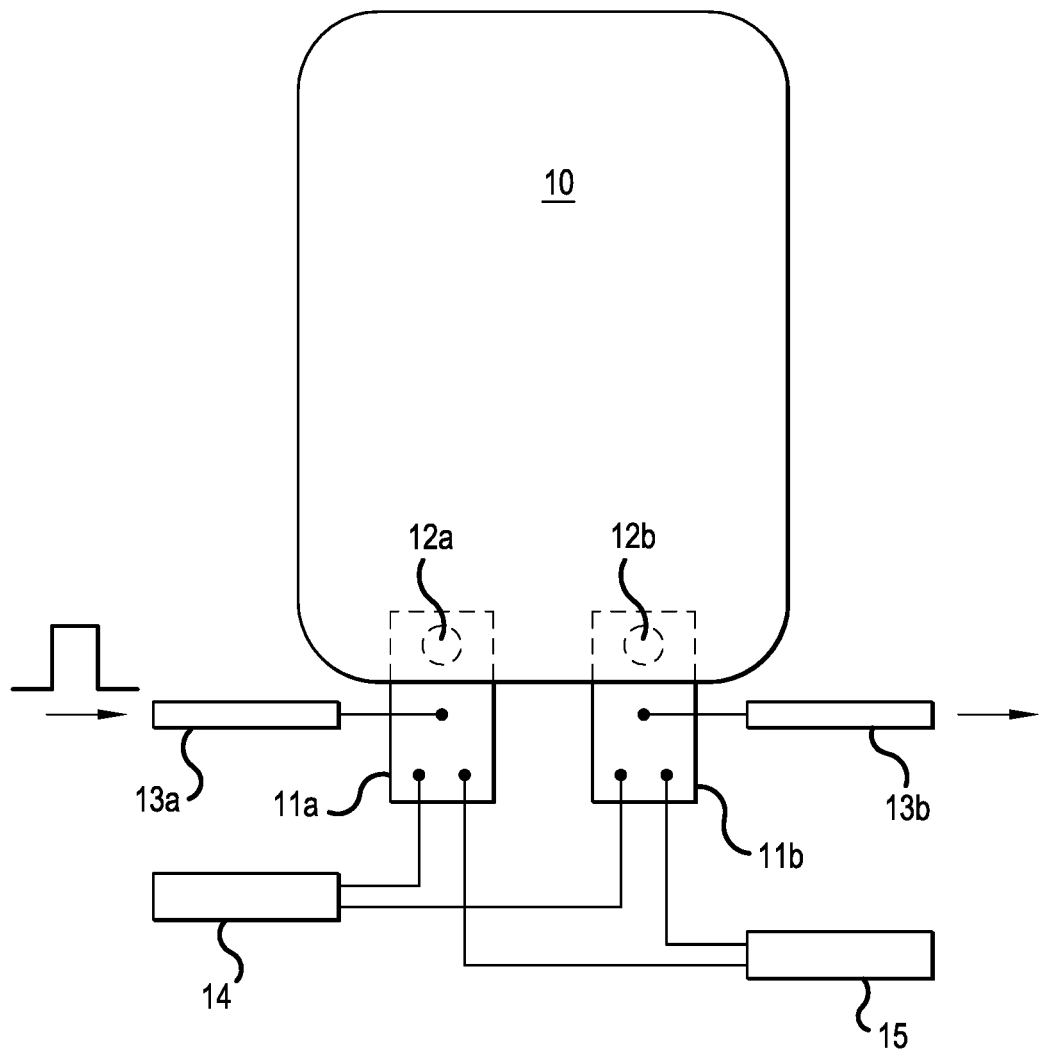
FIG. 2 is a schematic diagram of a test set-up for testing welds of a pouch cell battery according to an embodiment.

In the embodiment of FIG. 2, the stimulus component is realized by application of a pulsed DC current across the external electrodes 11a and 11b using wiring electrodes 13a and 13b. As a non-limiting example, the pulsed DC current may have an amplitude in the range from 1 to 100 amperes (for example 30 amperes) and a pulse width in the range of 1 to 60 seconds (for example 5 seconds).

The read-out component of the embodiment of FIG. 2 is realized by 4-terminal (4T) sensing. That is, as shown in FIG. 2, 4T sensing is characterized by separate pairs of current-carrying electrodes 14 (as force) and voltage-sensing electrodes 15 (as sense). However, the inventive concepts are not limited to 4T sensing of impedance, and other impedance or resistance measuring techniques may be adopted.

Figure 3:
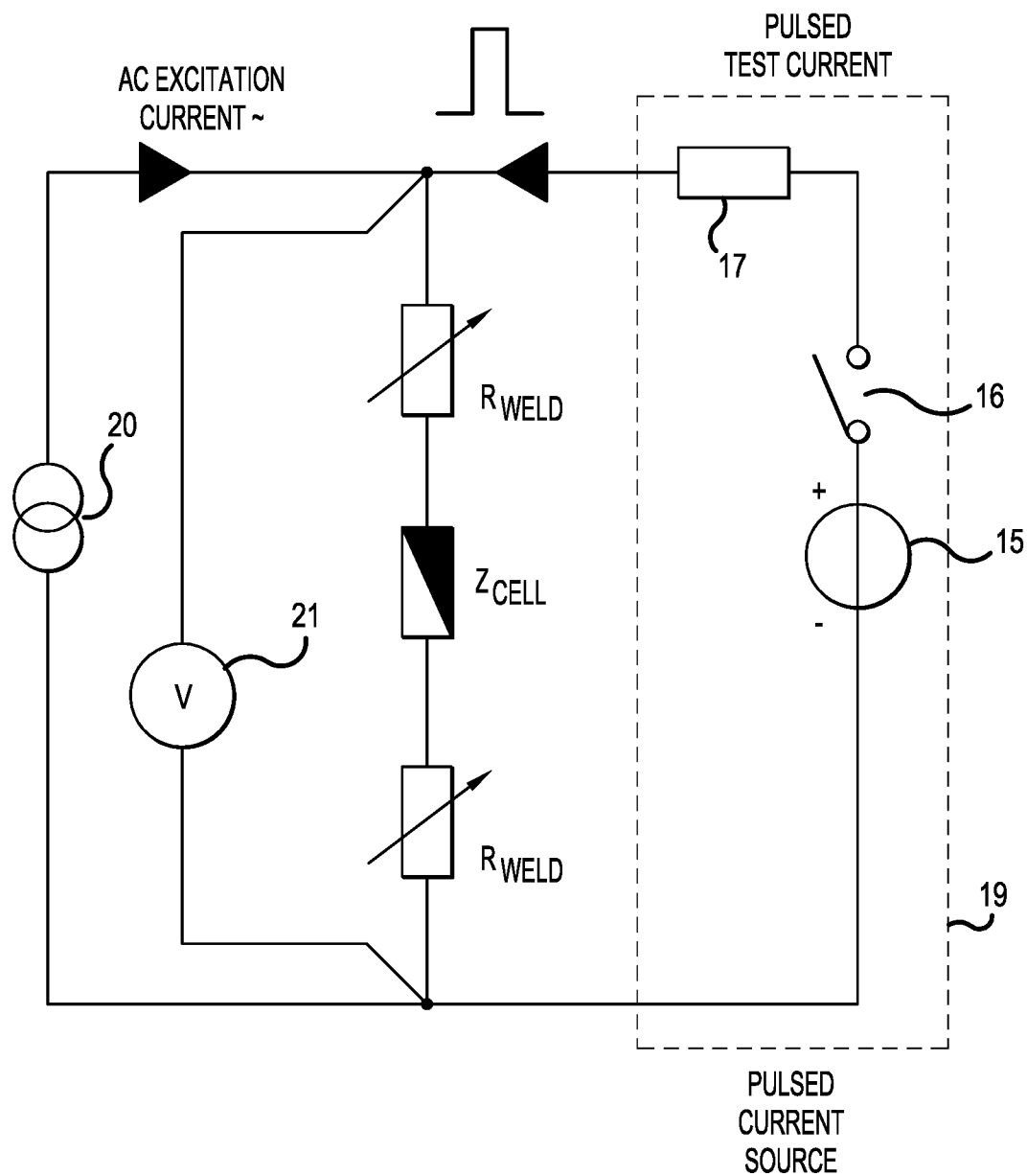
FIG. 3 is a circuit diagram of the test set-sup for testing welds of a pouch cell battery of FIG. 2.

FIG. 3 is a circuit diagram representative of the electrical set-up of the test configuration of FIG. 2. In the FIG. 3, Zcell denotes the impedance of the cells and connections within the pouch cell battery 100 of FIG. 2, and Rweld denotes the resistance of the welds 12a and 12b of FIG. 2. Rweld is variable with the application of stimulus.

Reference number 19 of FIG. 3 denotes a pulsed current source including a DC voltage source 15, a switch 16, and a resistive component 17. The pulsed current source 19 is operative to apply a pulsed DC test current across the electrical circuit including Rweld, Zcell and Rweld.

The electrical set-up is configured to measure changes in impedance of the welds in response to the stress applied by the pulsed DC current source 16. The quantity to be measured is Rweld. That is, the real part of the weld impedance is, empirically, of higher diagnostic validity than the imaginary part. It therefore may be desirable to choose a measurement frequency for the impedance measurement such that the background capacitance and inductance of the battery cell cancel out. Also, the frequency used for the impedance measurements should preferable allow for fast measurements. In combination with the above criterion, a frequency of about 1 kHz may be a good choice. Separately, in order to increase the signal-to-noise (S/N) ratio of the measurement, the stimulus itself may be modulated.

As shown in FIG. 3, the 4T impedance measuring method includes an AC current source 20 as force and a phase sensitive voltmeter 21 as sense.

Figure 4A:
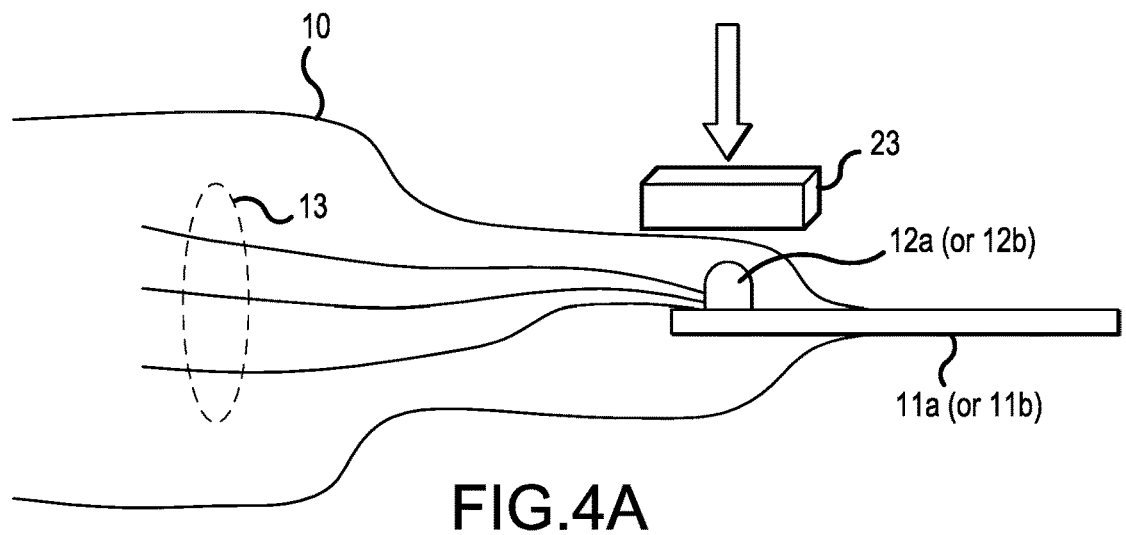
FIGS. 4A and 4B are schematic diagrams of a test set-up for testing welds of a pouch cell battery according to another embodiment.
Figure 4B:
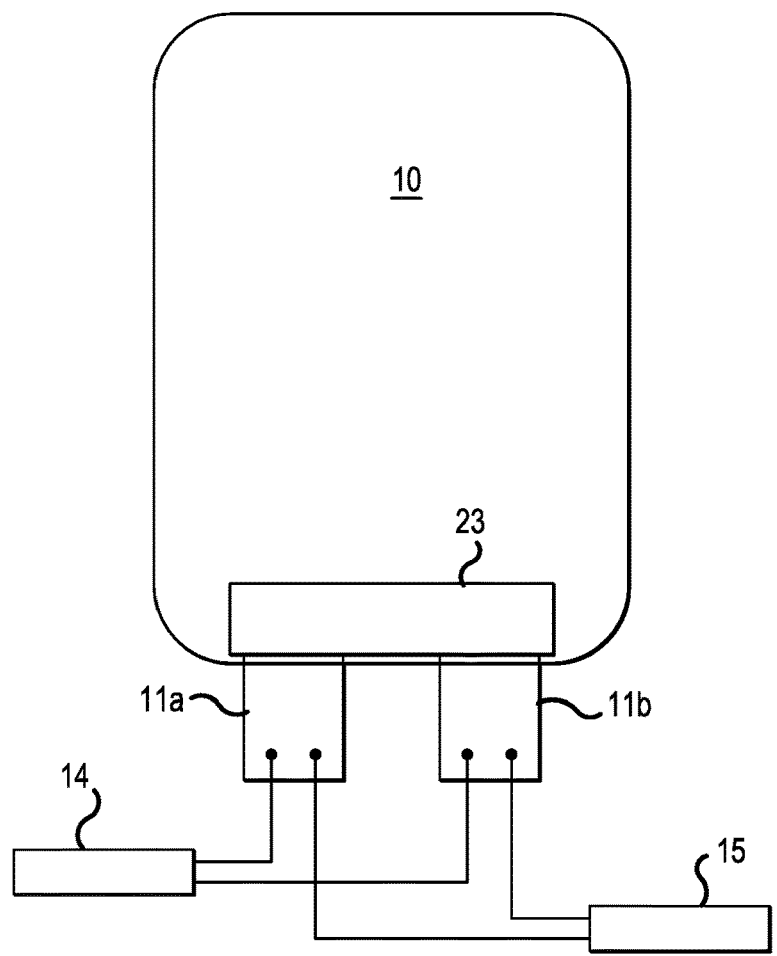

FIGS. 4A and 4B are schematic diagrams for reference in describing another embodiment of the inventive concepts. Again, the example given relates to the testing of the welds contained within a pouch cell battery 100, and like reference numbers denote like elements as described in connection with FIGS. 2 and 3. Here, however, the stimulus component is mechanical stress applied to the welds of the pouch cell battery 100.

Like the previous embodiment, impedance measurements are carried by 4T sensing. Thus, as shown in FIG. 4B, the configuration includes separate pairs of current-carrying electrodes 14 (as force) and voltage-sensing electrodes 15 (as sense).

The stimulus of the current embodiment is supplied by a mechanical actuator 23 applying a downward or compressive or bending or torque force to the welds 12a and 12b. When the mechanical actuator is engaged with the welds 12a and 12b, the welds are considered in a stressed state and impedance measurements are made by 4T sensing. As with the pulsed DC current applied as stimulus in the embodiment of FIGS. 2 and 3, the mechanical actuator can be periodically moved up and down to apply pulsed mechanical stress.

Figure 5:
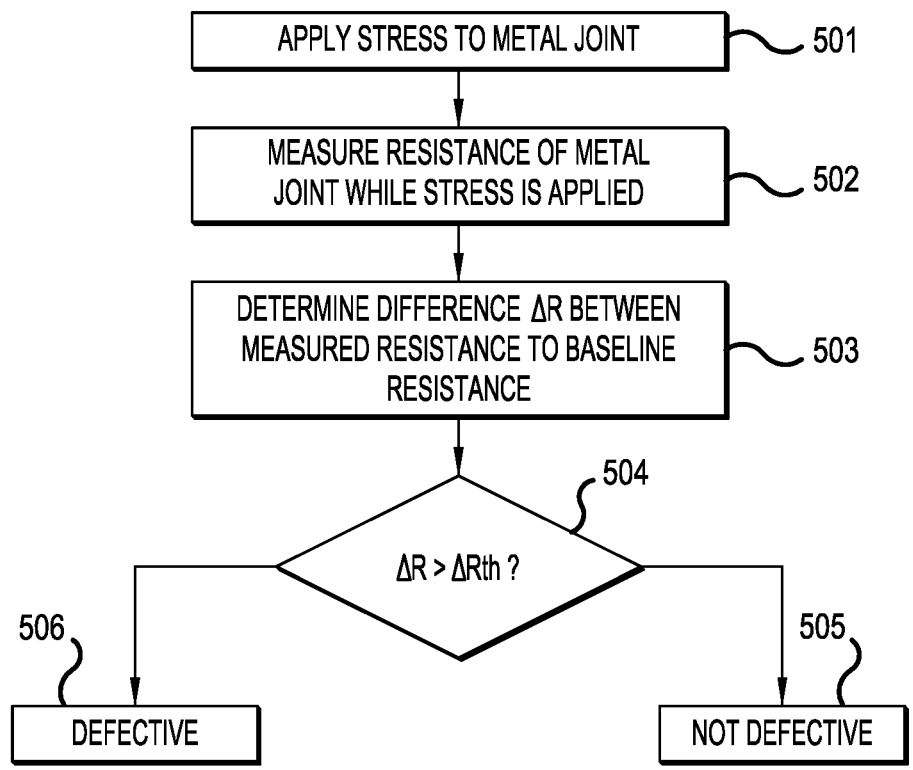
FIG. 5 is a flowchart for reference in describing a method for testing a metal joint according to an embodiment.

FIG. 5 is a flowchart for reference in describing a method of testing the structural integrity of a metal joint in accordance with embodiments of the inventive concepts.

Initially, at step 501, stress is applied to the metal joint. As mentioned previously, the metal joint may, as examples, be a welded joint, a solder joint, or a brazed joint, and the stress can take a variety of forms, such as mechanical stress, thermal stress, acoustic stress and electrical stress.

Next, at step 502, a resistance of an electrically conductive circuit including the metal joint is measured. The circuit can be made up of the metal joint alone (i.e., a measurement can be made directly across the metal joint). Alternatively, practicalities of the item or package containing the metal joint may dictate that the circuit include other components. See, for example, previously described FIG. 3 in which the circuit includes Zcell.

At step 503, the measured resistance is compared to a baseline resistance to determine a difference $\Delta R$ between the two. The baseline resistance may, for example, be derived from previous resistance measurements of non-stressed metal joints that are similarly configured and are known to have acceptable structural integrity. Alternatively, the baseline resistance can be obtained by measuring a resistance of the metal joint being tested in the absence of stress. If a difference between the baseline resistance and the measured resistance exceeds a predetermined threshold $\Delta Rth$, the metal joint is deemed defective (or of insufficient structural integrity). The predetermined threshold $\Delta Rth$ may be determined from data derived from the previous measurements of non-stressed metal joints that are similarly configured and known to have acceptable structural integrity, as well as previous resistance measurements of the same metal joints under stress.

Figure 6:
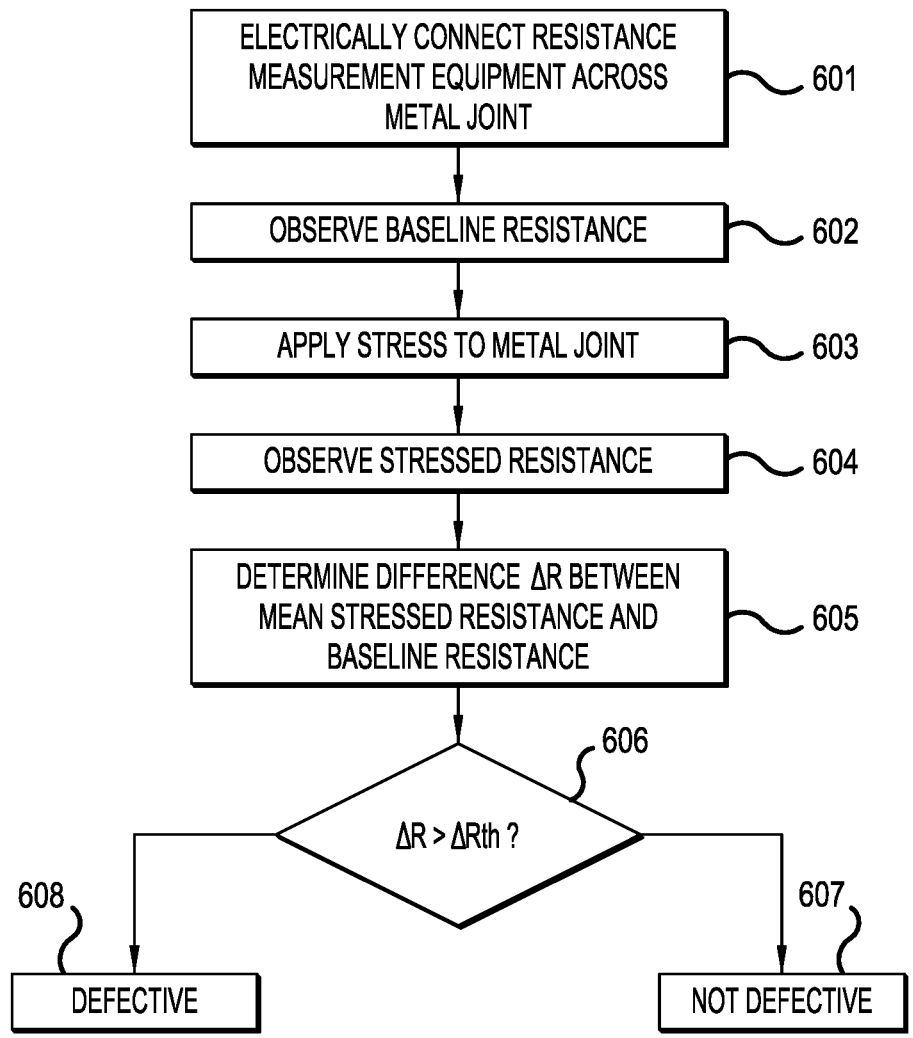
FIG. 6 is a flowchart for reference in describing a method for testing a metal joint according to another embodiment.

FIG. 6 is a flowchart for reference in describing a method of testing the structural integrity of a metal joint in accordance with other embodiments of the inventive concepts.

Initially, at step 601, resistance measuring equipment is electrically connected across the metal joint. As mentioned previously, the connection can be directly across the metal joint, or the connection can be across the metal joint in electrical contact with other components.

Next, at step 602, a resistance across the metal joint is observed using the equipment connected in step 601. This measurement is carried out to confirm that contact has been established successfully and to acquire a baseline resistance which will be compared to subsequent measurements.

At step 603, one or several external stimuli are applied to the cell, especially to parts of the cell in close proximity to the weld under investigation. As mentioned previously, the stimuli can take multiple forms. Examples include pulsed electrical currents, mechanical stress by actuators, localized heating (e.g. through heating elements, infrared radiation or lasers), and ultrasound, or vibrations in general, either in direct contact or via the air.

At step 604, a resistance across the stressed metal joint is observed using the equipment connected in step 601 to obtain a stressed resistance.

At step 605, a difference $\Delta R$ between the stressed resistance and the baseline resistance then determined.

Next, at step 606, a determination is made as to whether the difference $\Delta R$ exceeds a threshold difference $\Delta Rth$. In the case where the difference $\Delta R$ exceeds the threshold difference $\Delta Rth$, the metal contact is deemed defective at step 608. Otherwise, the metal contact is deemed not defective at step 607. The threshold difference $\Delta Rth$ may be determined from data derived from the previous measurements of non-stressed metal joints that are similarly configured and known to have acceptable structural integrity, as well as previous resistance measurements of the same metal joints under stress.

Figure 7:
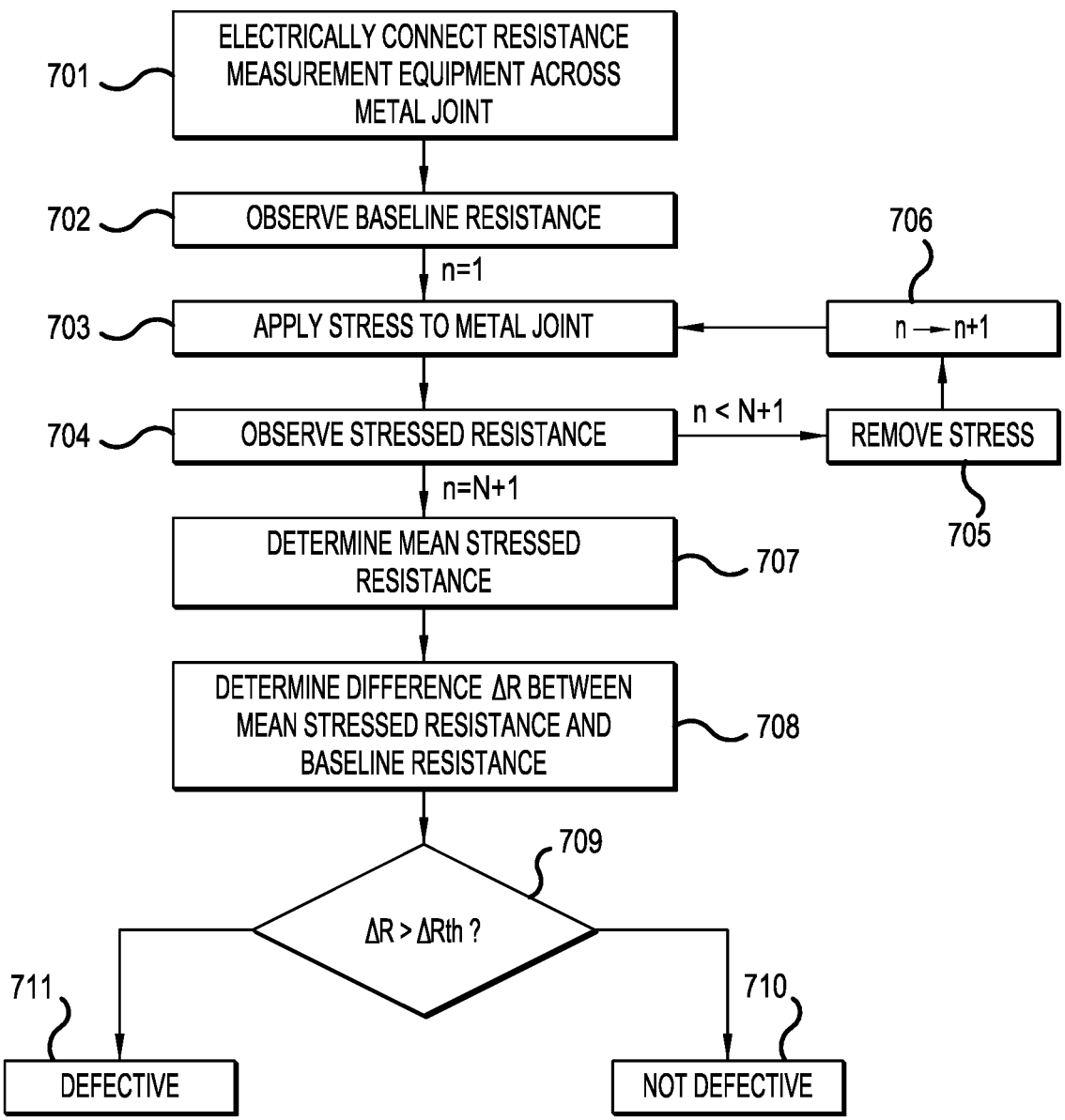
FIG. 7 is a flowchart for reference in describing a method for testing a metal joint according to another embodiment.

FIG. 7 is a flowchart for reference in describing a method of testing the structural integrity of a metal joint in accordance with other embodiments of the inventive concepts.

Initially, at step 701, resistance measuring equipment is electrically connected across the metal joint. As before, the connection can be directly across the metal joint, or the connection can be across the metal joint in electrical contact with other components.

Next, at step 702, a resistance across the metal joint is observed using the equipment connected in step 701. This measurement is carried out to confirm that contact has been established successfully and to acquire a baseline resistance which will be compared to subsequent measurements.

At step 703, one or several external stimuli are applied to the cell, especially to parts of the cell in close proximity to the weld under investigation. As mentioned previously, the stimuli can take multiple forms. Examples include pulsed electrical currents, mechanical stress by actuators, localized heating (e.g. through heating elements, infrared radiation or lasers), and ultrasound, or vibrations in general, either in direct contact or via the air.

At step 704, a resistance across the stressed metal joint is observed using the equipment connected in step 701 to obtain a stressed resistance.

The embodiment of FIG. 7 is at least partly characterized by obtaining multiple (N) measurements of the stressed resistance. As such, in the case where the number n of a given "n-th" measurement is less than the number (N+1) of an (N+1)-th measurement, the stress is removed temporarily at step 705, and n becomes n+1 at step 706. Stress is again applied to the metal joint at step 703 and a stressed resistance is observed at step 704 to obtain another stressed resistance measurement. The measurements are continued in this fashion until n=N+1, and thus N stressed resistance measurements are obtained.

At step 707, a statistical representation of the N stressed resistance measurements is determined. In the example of this embodiment, the statistical representation is a mean of the N stressed resistance measurements.

At step 708, a difference ΔR between a statistical representation (e.g., a mean) of the N stressed resistance measurements and the baseline resistance is determined.

Next, at step 709, a determination is made as to whether the difference ΔR exceeds a threshold difference ΔRth. In the case where the difference ΔR exceeds the threshold difference ΔRth, the metal contact is deemed defective at step 608. Otherwise, the metal contact is deemed not defective at step 607. The threshold difference ΔRth may be determined from data derived from the previous measurements of non-stressed metal joints that are similarly configured and known to have acceptable structural integrity, as well as previous resistance measurements of the same metal joints under stress.

Figure 8:
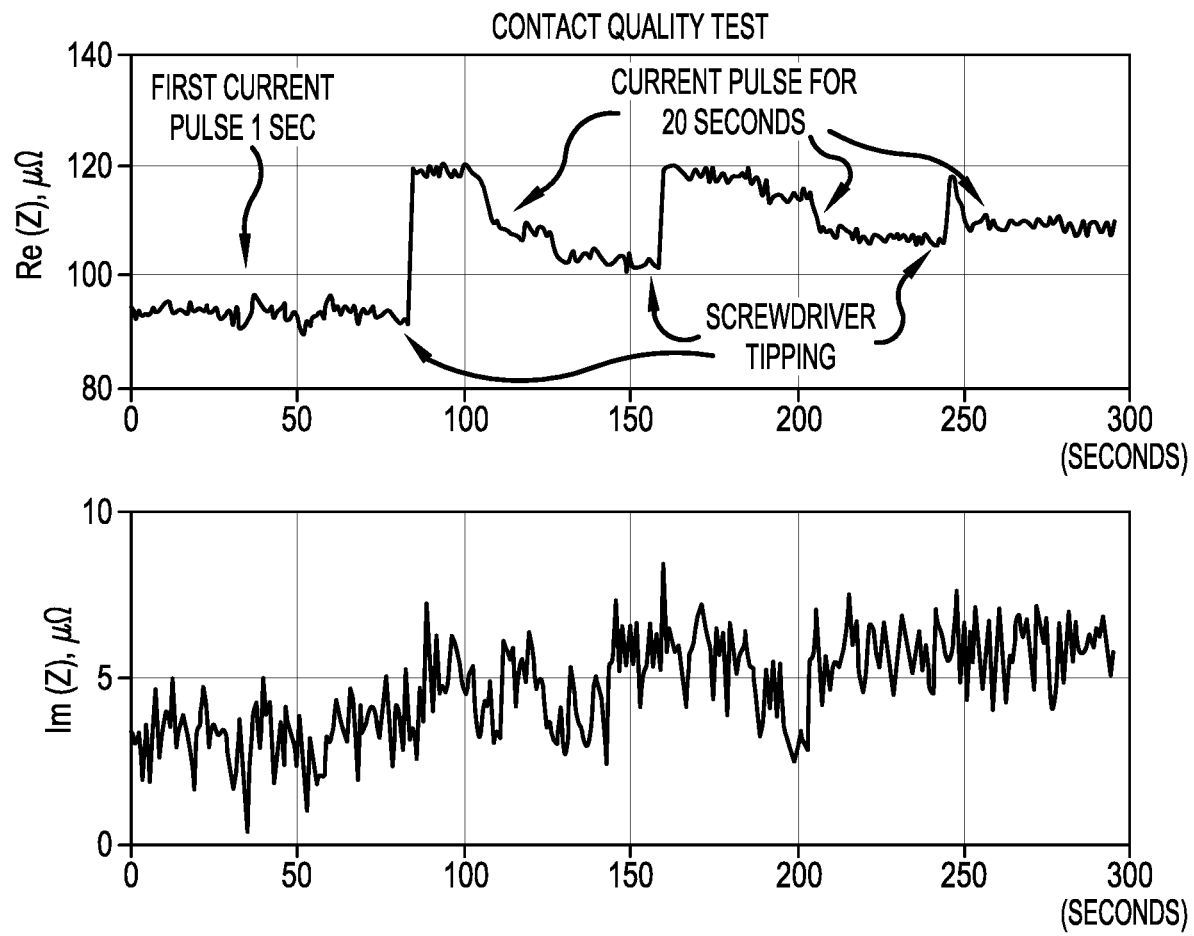
FIG. 8 is graph showing impedance measurements of a metal joint under stress.

FIG. 8 is a graph of impedance and resistance measurements derived from a preliminary experiment that was performed a piece of metal contacted through soldering. The stimulus applied in the experiment was a DC current pulse. Initially, during a first pulse duration of about 1 second, the resistance of the solder joint was on the order of 90+ micro-ohms. Then, the solder joint was intentionally damaged using a screwdriver, leading to an increased resistance of about 120 micro-ohms. It can be readily seen that the damage joint responds with decreasing resistance when stressed by the DC current pulse.

Figure 9:
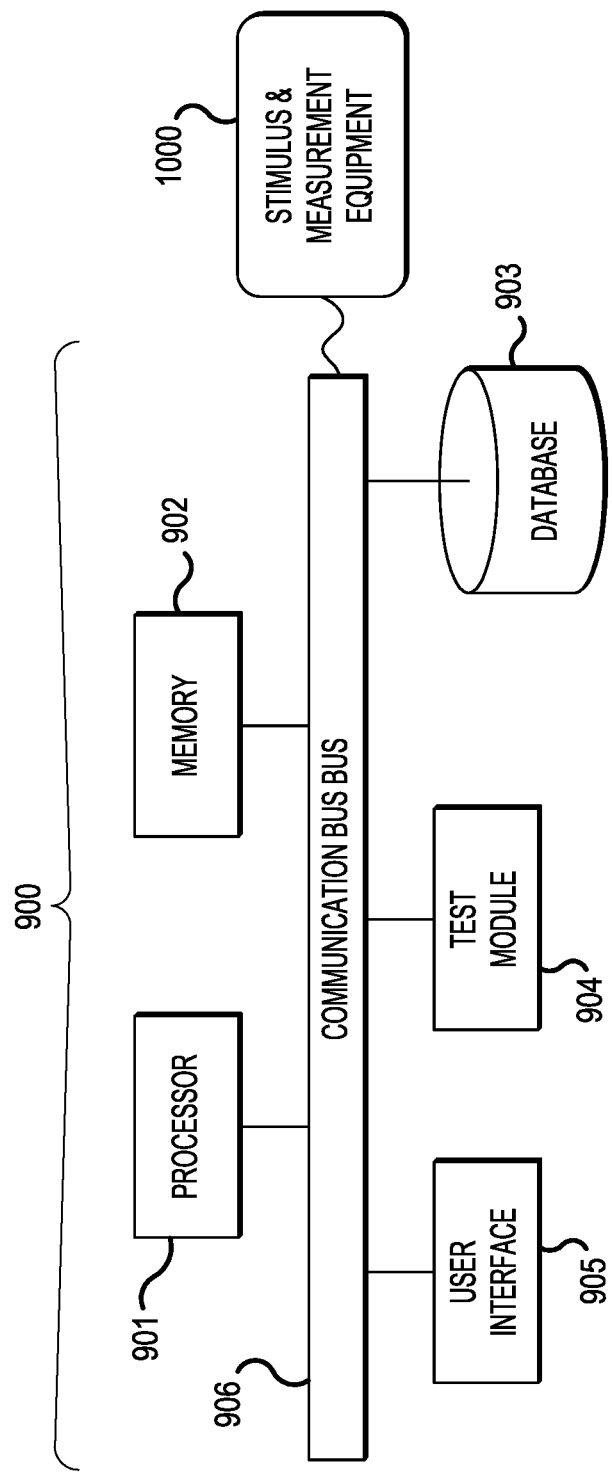
FIG. 9 is a simplified block diagram of a test automation platform (TAP) operatively coupled to stimulus and measurement equipment in accordance with a representative embodiment.

FIG. 9 is a simplified block diagram of a test automation platform (TAP) 900 operatively coupled to stimulus and measurement equipment 1000 in accordance with a representative embodiment.

The TAP 900 comprises a processor 901, a memory 902, a database 903, a test module 904 and a user interface 905. The test automation platform 900 communicates with various components, including the stimulus and measurement equipment 1000, using a communications bus 906.

The processor 901 may be any hardware device capable of executing instructions stored in memory 902 and in accordance with the test module 904. The processor 901 may execute the instructions to implement part or all of methods described herein. Additionally, the processor 901 may be distributed among multiple devices, e.g., to accommodate methods necessarily implemented in a distributed manner that requires multiples sets of memory/processor combinations.

The processor 901 is tangible and non-transitory, and is representative of one or more processors. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A processor is an article of manufacture and/or a machine component. The processor 901 of the TAP 900 is configured to execute software instructions to perform functions as described in the various embodiments herein. The processor 901 may be a general-purpose processor or may be part of an application specific integrated circuit (ASIC). The processor 901 may also be (or include) a microprocessor, a microcomputer, a processor chip, a controller, a microcontroller, a digital signal processor (DSP), a state machine, or a programmable logic device. The processor 901 may also be (or include) a logical circuit, including a programmable gate array (PGA) such as a field programmable gate array (FPGA), or another type of circuit that includes discrete gate and/or transistor logic. The processor 901 may be a central processing unit (CPU), a graphics processing unit (GPU), or both. Additionally, any processor described herein may include multiple processors, parallel processors, or both. Multiple processors may be included in, or coupled to, a single device or multiple devices.

The memory 902 and the database 903 may include various memories such as, for example, cache or system memory. As such, the memory 902 and database 903 may include static random-access memory (SRAM), dynamic RAM (DRAM), flash memory, read only memory (ROM), or other similar memory devices.

The memory 902 may include various modules, each of which comprises a set of related processor executable instructions corresponding to a particular function of the TAP 800.

The database 903 may contain a library of measured resistances of various types of metal joints, including data derived from previous measurements of non-stressed metal joints that are similarly configured and known to have acceptable structural integrity, as well as previous resistance measurements of the same metal joints under stress. The database 903 may include one or more machine-readable non-transitory storage media such as read-only memory (ROM), random-access memory (RAM), magnetic disk storage media, optical storage media, flash-memory devices, or similar storage media. In various embodiments, the database 903 may store instructions for execution by the processor 901 or data upon with the processor 901 may operate (alone or in conjunction with the memory 902 and test module 904.

The test module 904 is a software module executed by the processor 901 to control the stimulus and measurement equipment to carried out testing of metal joints in accordance with previous embodiments, and receive measurement data and results for storage in the database 903 and/or for display at the user interface 905.

The user interface 905 may include one or more devices for enabling communication with a user. The user interface 905 comprises Graphical User Interface (GUI) and Application Programming Interface (API). The GUI allows users to interact with TAP 900 via graphical representation of system configuration and setting. The API allows user to interact with TAP 900 via a set of programmable commands. As such, the API provides a programming interface to allow users to integrate the solution into their own environment, and also to allow the integration of customer specific metal joint profiles and libraries. The interface may also be used to extend the system for future protocols, both wired and wireless.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A method of testing a structural integrity of a metal joint, comprising
applying stress to the metal joint;
measuring a resistance of a circuit including the metal joint during application of the stress to the metal joint using a four-terminal (4T) sensing method by separate pairs of current-carrying electrodes and voltage-sensing electrodes, wherein the measured resistance, and baseline resistances are respectively obtained from a real part of a measured complex impedance of the metal joint under stress and a real part of a measured complex impedance of the metal joint not under stress; and determining a structural integrity of the metal joint according to a magnitude of a difference between the measured resistance and the baseline resistance.

2. The method of claim 1, wherein the metal joint is a weld.

3. The method of claim 1, wherein the metal joint is a weld of a battery.

4. The method of claim 1, wherein the stress is at least one of mechanical stress, thermal stress, acoustic stress and electrical stress.

5. The method of claim 4, wherein the stress is applied by driving an electric current through the metal joint.

6. The method of claim 5, wherein the electric current is a pulsed DC current.

7. The method of claim 4, wherein the stress is applied by a mechanical actuator.

8. he method of claim 1, further comprising obtaining the baseline resistance by measuring a resistance of the metal joint in the absence of stress applied to the metal joint.

9. A system for testing a structural integrity of a metal joint, comprising:

a stimulus device configured to stress the metal joint;

a resistance measuring device configured to measure a resistance of the metal joint while the metal joint is stressed by the stimulus device, wherein the resistance is measured using a four-terminal (4T) sensing method by separate pairs of current-carrying electrodes and voltage-sensing electrodes; and a test automation platform, comprising a memory that stores executable instructions, and a processor configured to execute the instructions retrieved from the memory, wherein the instructions, when executed, cause the processor to determine a structural integrity of the metal joint based on a comparison between the measured resistance and a baseline resistance, wherein: the resistance measuring device is configured to measure a complex impedance of the metal joint while the metal joint is under stress; and the instructions, when executed by the processor, cause the processor to determine a difference between a real component of the measured impedance and the baseline resistance.

10. The system of claim 9, wherein the stimulus device and the resistance measuring device operate under control of the test automation platform.

11. The system of claim 9, wherein the stress is at least one of mechanical stress, thermal stress, acoustic stress and electrical stress.

12. The system of claim 9, wherein the stimulus device includes a mechanical actuator configured to apply mechanical stress to the metal joint.

13. The system of claim 9, wherein the stimulus device includes a current source configured to apply a pulsed DC current across the metal joint.

14. The system of claim 9, wherein the metal joint is a weld.

15. A method of testing a structural integrity of a metal joint, comprising:

measuring a resistance of the metal joint to obtain a baseline impedance of the metal joint;

applying stress to the metal joint;

measuring a resistance of the metal joint during application of the stress to the metal joint using a four-terminal (4T) sensing method by separate pairs of current-carrying electrodes and voltage-sensing electrodes to obtain a stressed resistance of the weld;

determining a measured difference between the baseline resistance of the metal joint and the stressed resistance of the metal joint; and comparing the measured difference to a threshold value, wherein a test result is a lack structural integrity when the measure difference exceeds the threshold value, wherein the measured and baseline resistances are respectively obtained from a real part of a measured complex impedance of the metal joint under stress and a real part of a measured complex impedance of the metal joint not under stress.

16. The method of claim 15, wherein the metal joint is a weld.

17. The method of claim 15, wherein the stress is at least one of mechanical stress, thermal stress, acoustic stress and electrical stress.

* * * * *